United States Patent
Yang et al.

(10) Patent No.: US 8,004,091 B2
(45) Date of Patent: Aug. 23, 2011

(54) SEMICONDUCTOR PACKAGE, METHOD OF FABRICATING THE SAME, AND SEMICONDUCTOR PACKAGE MOLD

(75) Inventors: Seung-yeol Yang, Hwaseong-si (KR);
Sang-wook Park, Cheonan-si (KR);
Seung-jae Lee, Cheonan-si (KR);
Min-young Son, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 269 days.

(21) Appl. No.: 12/078,598

(22) Filed: Apr. 2, 2008

(65) Prior Publication Data
US 2008/0237889 A1      Oct. 2, 2008

(30) Foreign Application Priority Data
Apr. 2, 2007   (KR) .................. 10-2007-0032516

(51) Int. Cl.
*H01L 23/498* (2006.01)
*H01L 21/60* (2006.01)
(52) U.S. Cl. ............. 257/777; 257/687; 257/E23.061; 257/E21.512; 438/768
(58) Field of Classification Search .......... 257/687, 257/777; 438/15, 127
See application file for complete search history.

(56) References Cited

U.S. PATENT DOCUMENTS

| | | | |
|---|---|---|---|
| 6,867,506 | B2 | 3/2005 | Barrett |
| 2002/0025607 | A1* | 2/2002 | Danno et al. ................ 438/126 |
| 2002/0130422 | A1* | 9/2002 | Venkateshwaran .......... 257/778 |
| 2002/0175401 | A1* | 11/2002 | Huang et al. ................. 257/686 |
| 2004/0135262 | A1* | 7/2004 | Masuda et al. ............... 257/777 |
| 2005/0056919 | A1* | 3/2005 | Cobbley ........................ 257/680 |
| 2005/0194676 | A1* | 9/2005 | Fukuda et al. ................ 257/698 |

FOREIGN PATENT DOCUMENTS

| | | |
|---|---|---|
| JP | 2000-114427 | 4/2000 |
| JP | 2004-311668 | 11/2004 |

* cited by examiner

*Primary Examiner* — N Drew Richards
*Assistant Examiner* — Mamadou Diallo
(74) *Attorney, Agent, or Firm* — Harness, Dickey & Pierce, P.L.C.

(57) ABSTRACT

A semiconductor package includes one or more semiconductor chips to form a semiconductor package. The semiconductor package may include a first semiconductor chip package having a first substrate including a first surface having a center portion on which a first semiconductor chip is mounted, at least one first boundary portion on which a plurality of conductive connection pad groups are formed, and/or a molding member including a body that covers the first semiconductor chip and at least one extension that extends from the body. The extension extends while avoiding the conductive connection pad group. The semiconductor package may further include a second semiconductor chip package stacked on the first semiconductor chip package and including a second substrate on which at least one second semiconductor chip that is electrically connected to the conductive connection pad group may be mounted.

25 Claims, 4 Drawing Sheets

SEMICONDUCTOR PACKAGE, METHOD OF FABRICATING THE SAME, AND SEMICONDUCTOR PACKAGE MOLD

PRIORITY STATEMENT

This non-provisional patent application claims priority under 35 U.S.C. §119 to Korean Patent Application No. 10-2007-0032516, filed on Apr. 2, 2007, in the Korean Intellectual Property Office, the entire contents of which is incorporated herein by reference.

BACKGROUND

Description of the Related Art

As semiconductor industries develop, electronic devices are rapidly being miniaturized, reduced in weight, and multi-functionalized. Accordingly, multi-stack package (MSP) technology, which may encapsulate the same or different types of semiconductor chips in one unit package, has been developed. MSP technology is advantageous in terms of the size, weight, and mounting area of a package compared to encapsulating each semiconductor chip in an individual package. Specifically, as the size of a portable computer decreases, a need for a small form factor (SFF) increases. The SFF may be realized by fabricating a package by mounting a greater number of semiconductor chips to implement an integrated circuit with high integration and high performance, or fabricating a single semiconductor package by combining different types of semiconductor chips.

FIG. 1 is a cross-sectional view illustrating a conventional MSP 10.

Referring to FIG. 1, the conventional MSP 10 may have a stacked structure including a lower semiconductor chip package 20. A first semiconductor chip 22, mounted on a first substrate 21, may be partially molded by a first molding member 23, such as an epoxy molding compound. The MSP 10 may also include an upper semiconductor chip package 30, having a second semiconductor chip 32 mounted on a second substrate 31 that may be molded by a second molding member 33. The lower package 20 and the upper package 30 may be vertically arranged. A first land 24 and a second land 34 may be formed on the first and second substrates 21 and 31, respectively, to electrically connect the first and second substrates 21 and 31 to an external circuit (not shown).

The lower semiconductor chip package 20 and the upper semiconductor chip package 30 may be electrically connected to each other by a solder ball 35 for stacking that operates as a joint between the first and second lands 24 and 34. The MSP 10 may be electrically connected to the external circuit by a solder ball 25 that may be formed on the bottom surface of the first substrate 21.

Generally, to stack the upper semiconductor chip package 30 on the lower semiconductor chip package 20, for example, the solder ball 35 attached to the upper semiconductor chip package 30 may be arranged on the first land 24 of the lower semiconductor chip package 20. Then, the solder ball 35 may be thermo-compression bonded to the first land 24. A reflow method may be also used to melt the solder ball 35 and join the solder ball 35 and the first land 24.

As illustrated in FIG. 1, in the conventional MSP 10, the first molding member 23 is only formed on a center portion C on the first substrate 21 where the first semiconductor chip 22 is formed. The first molding member may not be formed on a boundary portion E of the first substrate 21 that includes a peripheral area of the first land 24 that is outside of the first semiconductor chip 22.

The first substrate 21 and/or the second substrate 31 may include various conductive members, such as printed wire patterns, lands, solder balls, and insulating members. Such conductive members and insulating members may be bendable and/or breakable. According to a trend of miniaturization in electronic products, the thicknesses of the first and second substrates 21 and 31 may need to be reduced to, for example, approximately 0.2 mm to 0.8 mm. Accordingly, in the conventional MSP 10, the boundary portion E of the first substrate 21, where the first molding member 23 is not covered, is mechanically very weak compared to the center portion C of the first substrate 21 molded by the first molding member 23. Consequently, when the lower semiconductor chip package 20 and the upper semiconductor chip package 30 are bonded using a thermo-compression bonding method, the boundary portion E of the first substrate 21 may often be cracked and/or warped due to thermo-stress and mechanical pressure.

When the boundary E is cracked and/or warped, an interval between the first and second substrates 21 and 31 may be altered. Thus, the connection between the solder ball 35 and the first land 24 may fail. In the conventional MSP 10, the first and second substrates 21 and 31 are generally aligned according to optical information. In this case, when the boundary portion E of the substrate 21 is cracked or warped, the first and second substrate 21 and 31 may be misaligned. Thus, the connection between the solder ball 35 and the first land 24 may fail and/or the solder ball 35 may be connected to another adjacent first land 24. Also, the conventional MSP 10 including the first substrate 21 that has the mechanically weak boundary portion E may be easily damaged during subsequent processes, such as assembling processes, testing processes, and processes of mounting the MSP 10 on an external substrate.

SUMMARY

Example embodiments provide a semiconductor package for a multi-stack package (MSP), which may reduce cracking and/or warpage in an area of a substrate where a molding member is not present, and thereby may reduce performance defects and/or reduce weaknesses caused by cracking and/or warpage.

Example embodiments may also provide a method of fabricating a semiconductor package for an MSP, which may improve yield by more easily stacking a plurality of semiconductor chip packages by increasing mechanical strength of a boundary portion of a substrate on which a semiconductor chip is mounted.

Example embodiments may also provide a mold for performing a partial molding process on a substrate to fabricate the semiconductor package of the MSP.

According to at least some example embodiments, there is provided a semiconductor package for a multi-stack package (MSP) that may include a first semiconductor chip package having a first substrate including a first surface with a center portion on which a first semiconductor chip may be mounted, and at least one first boundary portion on which a plurality of conductive connection pad groups may be formed. The semiconductor package may also include a molding member, including a body that may cover the first semiconductor chip, and at least one extension that may extend from the body toward a corner portion of the first surface of the first substrate and the extension may avoid the conductive connection pad group.

The MSP may further include a second semiconductor chip package, stacked on the first semiconductor chip package, the second semiconductor chip including a second substrate on which at least one second semiconductor chip that may be electrically connected to the conductive connection pad group.

In an example embodiment, the extension of the molding member may cover at least one entire corner portion of the first surface of the first substrate. The first surface of the first substrate may further include at least one of a second boundary portion on which a conductive connection pad group is not formed. The extension of the molding member may cover a part of, or the entire, second boundary portion and both corner portions adjacent to the second boundary portion.

In an example embodiment, at least one of the first and second substrates may include a printed circuit substrate formed of a ceramic, a flexible resin, or the like. The first semiconductor chip may be electrically connected to the first surface of the first substrate via a wire bonding, flip-chip bonding, or the like. The first and second semiconductor chips may be the same or different types. At least one of the first and second semiconductor chips may comprise a logic chip, a memory chip, or an RF communication chip, for example.

In an example embodiment, the first substrate may include a second surface opposite to the first surface, and the second surface may have a plurality of conductors for mounting. The conductors for mounting may be leads or conductive bumps, for example. The conductive bumps may be deposited metal bumps, solder balls, stud bumps, or the like.

In an example embodiment, the second substrate may include a third surface on which the second semiconductor chip may be mounted, and a fourth surface opposite to the third surface. The fourth surface may include a plurality of conductors for connecting to a conductive connection pad group for stacking. The conductors for stacking may be conductive bumps, for example. The conductive bumps may be solder balls, gold bumps, stud bumps, or the like.

The first and second semiconductor chip packages may be stacked by bonding, such as by performing a thermo-compression bonding method or a reflow method, for example, on the conductors between the first and second semiconductor chip packages. In this case, even when thermo and/or mechanical stresses are applied to a corner portion and a boundary portion of the first substrate, the boundary of the first substrate may be strengthened by the extension of the molding member. Accordingly, while stacking the second semiconductor chip package on the first semiconductor chip package, cracking and/or warpage phenomena of the first substrate may be suppressed and/or reduced.

According to at least some example embodiments, there is provided a method of fabricating a semiconductor package and an MSP. The method may include providing a first substrate having a first surface which includes a center portion on which a first semiconductor chip is mounted and at least one first boundary portion on which a plurality of conductive connection pad groups may be formed, and a second surface which may include a plurality of conductors for mounting, and forming a molding member having a body that covers the first semiconductor chip on the center of the first substrate, and at least one extension that extends from the body toward a corner of the first surface of the first substrate while avoiding the conductive connection pad group of the first substrate. The method may also include providing a second semiconductor chip package on the first substrate, the semiconductor chip package having a second substrate that includes a third surface on which at least one second semiconductor chip is mounted, and a fourth surface including a plurality of conductors for stacking connected to the conductive connection pads of the first substrate.

In an example embodiment, the providing of the second semiconductor chip package may include aligning the conductors for stacking with the conductive connection pads of the first substrate, and coupling the conductors for stacking and the conductive connection pads of the first substrate. The coupling of the conductors for stacking and the conductive connection pads of the first substrate may be performed by using a thermo-compression bonding method or a reflow method on the conductive connection pads, for example.

According to at least some example embodiments, there is provided a semiconductor package mold for fabricating a semiconductor package for an MSP that may include a substrate that includes a first surface having a center on which a semiconductor chip may be mounted and at least one first boundary portion on which a plurality of conductive connection pad groups may be formed, and a second surface opposite to the first surface. The semiconductor package mold may include a first mold having a cavity for performing a partial molding process on the first surface of the substrate, and a second mold supporting the substrate by contacting the second surface of the substrate. The cavity may be defined by a first internal surface contacting the first boundary portion on which the conductive connection pad groups of the substrate are formed, and a second internal surface surrounding upper portions of both corner portions adjacent to the first boundary portion. The substrate may include a second boundary portion on which the conductive connection pad group is not formed, and the cavity further includes a third internal surface surrounding an upper portion of the second boundary portion.

BRIEF DESCRIPTION OF THE DRAWINGS

Example embodiments will be described in detail with reference to the attached drawings in which.

DETAILED DESCRIPTION OF EXAMPLE EMBODIMENTS

Figure 1:
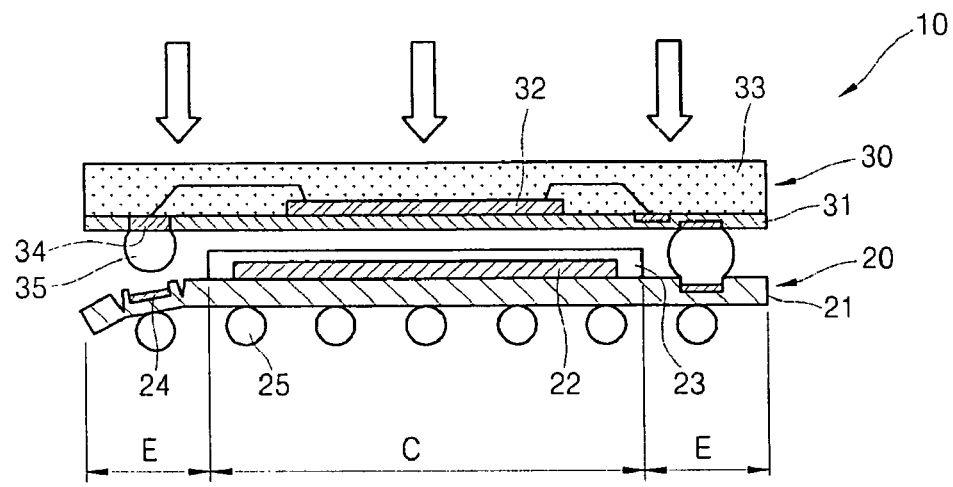
FIG. 1 is a cross-sectional view illustrating a conventional multi-stack package (MSP)

Hereinafter, example embodiments will be described more fully with reference to the accompanying drawings. Example embodiments may, however, be embodied in many different forms and should not be construed as being limited to example embodiments set forth herein. Rather, these example embodiments are provided so that this disclosure will be thorough and complete.

In the drawings, the thicknesses and size of layers are exaggerated for clarity. It will also be understood that when a layer is referred to as being "on" another layer, it may be directly on the other layer, or intervening layers may also be present. In the present application, the term "and/or" includes any one of the listed elements or a combination of at least one listed elements.

The terms used in the present application are used to describe example embodiments, and do not limit example embodiments. A singular form may include a plural form unless another case is clearly pointed out in the context. Also, the terms "comprise" and/or "comprising" specify existence of mentioned shapes, numbers, steps, operations, members, elements and/or groups thereof, but do not exclude existence or addition of more than one another shapes, numbers, operations, members, elements, and/or groups. In the present application, terms such as first and second are used to describe various members, components, areas, layers, and/or parts, but the members, components, areas, layers, and/or parts are not limited by such terms. These terms are only used to classify one member, component, area, layer, or part from another member, component, area, layer, or part. Accordingly, a first member, component, area, layer, or part that is to be described below may designate a second member, component, area, layer, or part without deviating from the teachings of the present invention.

In the present application, a substrate may have a predetermined or desired polygonal or round shape, and a boundary portion is an outer area of an area of the substrate on which a semiconductor chip is disposed and includes the edge of the substrate. A corner portion is an area where the adjacent boundaries cross each other, and includes a vertex of the substrate.

In the drawings, shapes of the illustrated embodiments may change according to, for example, a fabricating technology and/or tolerance. Accordingly, it should be understood that the shapes of example embodiments are not limited to the shapes illustrated in the drawings, but may be changed, for example, during fabrication.

Figure 2:
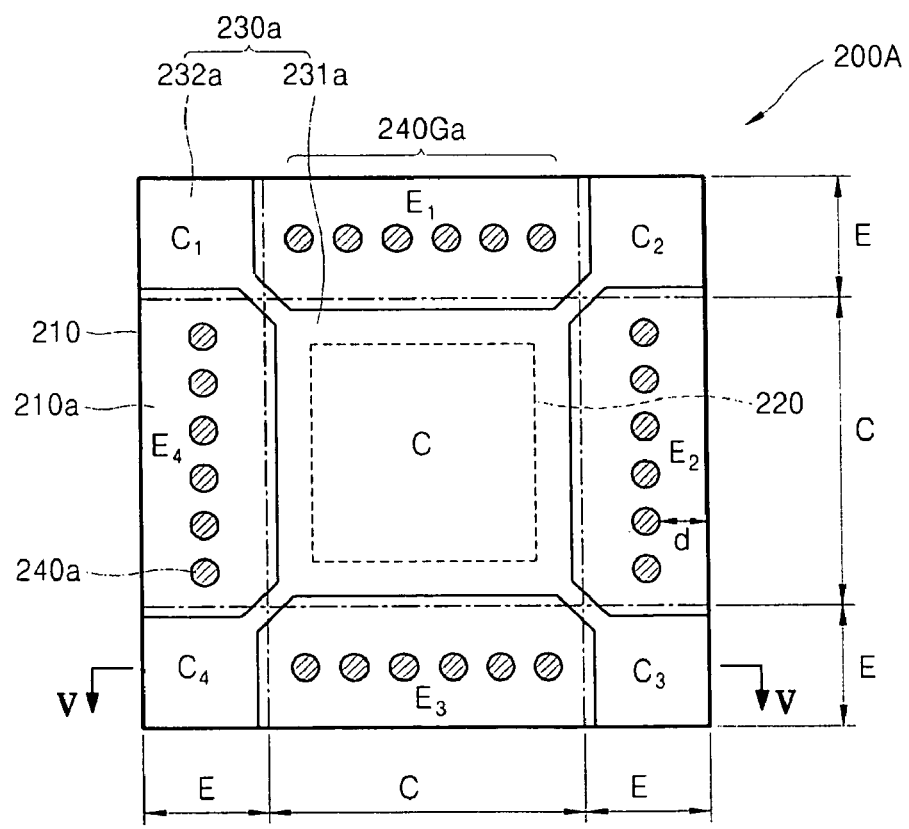
FIGS. 2 and 3 are plan views illustrating semiconductor chip packages forming an MSP according to an example embodiment.
Figure 3:
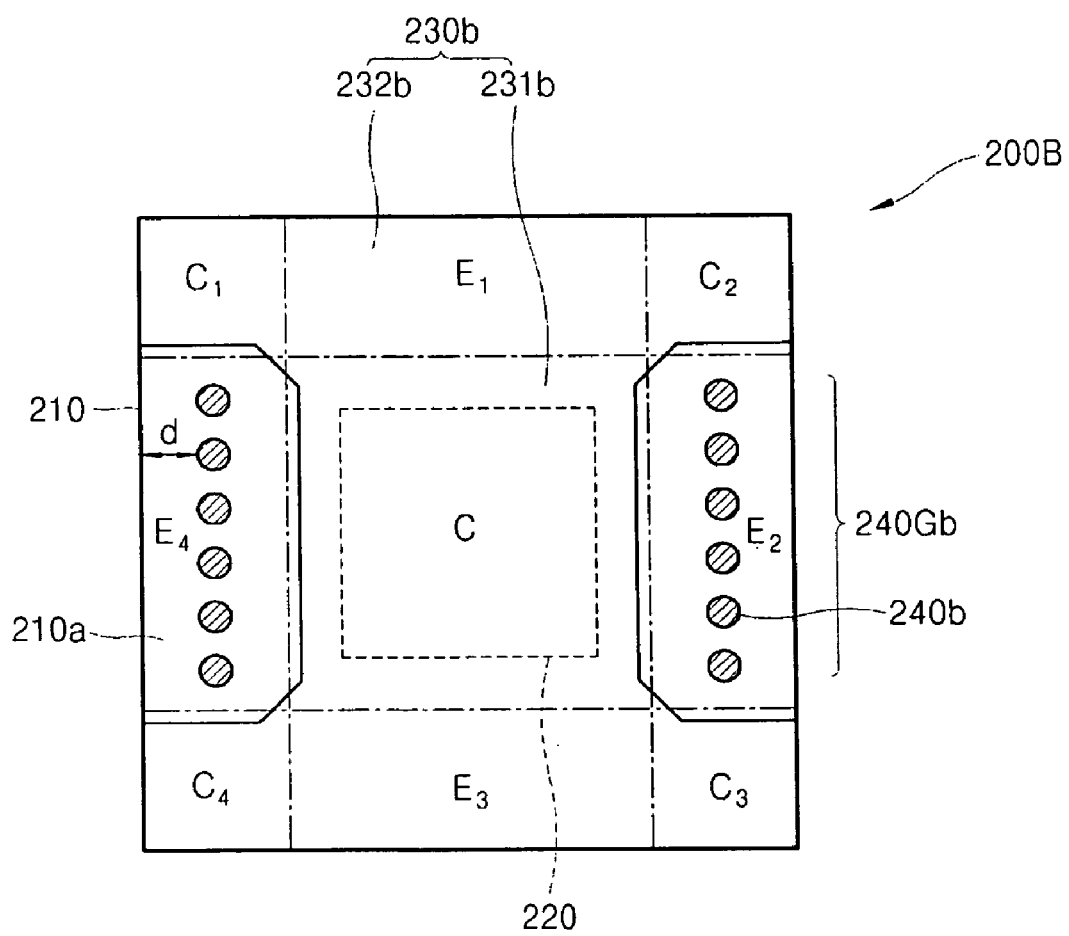

FIGS. 2 and 3 are plan views illustrating semiconductor chip packages 200A and 200B forming a multi stack package (MSP) according to an example embodiment.

Referring to FIGS. 2 and 3, the semiconductor chip packages 200A and 200B, according to example embodiments, may include a substrate 210 including a first surface 210a on which a semiconductor chip 220 shown in a dotted line is mounted. As illustrated in alternative long and short dash lines, the first surface 210a of the substrate 210 is divided into a center portion C and boundary portions $E_1$, $E_2$, $E_3$, and $E_4$ around the center portion C. The semiconductor chip 220 may be mounted within the center portion C of the substrate 210, and a plurality of conductive connection pad groups 240Ga and 240Gb including conductive connection pads 240a and 240b to be connected to an external circuit may be formed on the boundary portions $E_1$, $E_2$, $E_3$, and $E_4$. The substrate 210 may be a conventional printed circuit substrate, a ceramic substrate, a flexible substrate, or the like.

According to an example embodiment, the conductive connection pad groups 240Ga may be provided on all boundary portions $E_1$, $E_2$, $E_3$, and $E_4$ of the first surface 210a of the substrate 210, as illustrated in FIG. 2. According to an example embodiment, the conductive connection pad groups 240Gb may also be provided on two boundary portions $E_2$ and $E_4$ so as to face each other on the first surface 210a of the substrate 210. The arrangements of the conductive connection pad groups 240Ga and 240Gb are not limited thereto, and may have any form on the boundary portions $E_1$, $E_2$, $E_3$, and $E_4$ around the semiconductor chip 220 on the substrate 210.

The conductive connection pads 240a and 240b are conductive members electrically connectable to another semiconductor chip package stacked on the semiconductor chip packages 200A and 200B, and as is well known in the related art, the conductive connection pads 240a and 240b may be referred to as leads or lands, for example. The conductive connection pads 240a and 240b, for example, may be formed of at least one metal layer. Some, or all, of the conductive connection pads 240a or 240b may be electrically connectable to the semiconductor chip 220 mounted on the substrate 210 according to a conductive pattern (not shown).

As shown in FIG. 2, a single semiconductor chip 220 may be mounted on the substrate 210. Alternatively, a semiconductor chip module, including a plurality of semiconductor chips, may be mounted or stacked on the substrate 210. As is well known in the related art, the semiconductor chip 220 may be connected to the conductive pattern on the substrate 210 via wire bonding, flip-chip bonding, or the like. Molding members 230a and 230b may be formed by performing a partial molding process on the first surface 210a of the substrate 210 while the semiconductor chip 220 is mounted on the first surface 210a.

The partial molding process may be performed by a transfer molding process, which is well known in the related art, and a curable resin, such as epoxy mold compound, may be used as a molding material, for example. A mold for performing the partial molding process will be described later with reference to FIG. 5.

As illustrated in FIG. 2, the molding member 230a according to an example embodiment may include a body 231a, which covers the semiconductor chip 220 to protect the semiconductor chip 220, and an extension 232a, which may extend from the body 231a toward corner portions $C_1$, $C_2$, $C_3$, and $C_4$ of the first surface 210a of the substrate 210 while avoiding the conductive connection pad groups 210Ga disposed on the boundary portions $E_1$, $E_2$, $E_3$, and $E_4$. For example, the extension 232a may extend through a space between the conductive connection pad groups 240Ga on the first surface 210a of the substrate 210. The extension 232a of the molding member 230a may cover at least a part of, or the entire (as illustrated in FIG. 2, including a part of vertexes or edges of the polygonal substrate 210), corner portions $C_1$, $C_2$, $C_3$, and $C_4$ of the first substrate 210a of the substrate 210.

As illustrated in FIG. 3, the molding member 230b, according to an example embodiment, may include a body 231b which covers the semiconductor chip 220, and an extension 232b which may cover at least a part of, or the entire, boundary portions $E_1$ and $E_3$ on which the conductive connection pad groups 240Gb are not formed, as well as both corner portions $C_1$:$C_2$, and $C_3$:$C_4$ adjacent to the $E_1$ and $E_3$. As illustrated in FIGS. 2 and 3, according to an example embodiment, the extensions 232a and 232b of the molding members 230a and 240b may be defined to have the same, or a similar, shape along the edges of the substrate 210.

As described above, the extensions 232a and 232b of the molding members 230a and 230b cover the substrate 210 as much as possible by using the corners $C_1$, $C_2$, $C_3$, and $C_4$, which are between the conductive connection pad groups 240Ga and 240Gb of the substrate 210. As for a chip scale package, recently, distances d between the conductive connection pad groups 240a and 240b and the substrate 210 decrease as the sizes of the semiconductor chip packages 200A and 200B are reduced. Accordingly, the molding members 230a and 230b are formed in such a way that the extensions 232a and 232b may be formed on the corners $C_1$, $C_2$, $C_3$, and $C_4$ of the substrate 210. After forming the molding member 230a and 230b on the substrate 210, another semiconductor chip package may be stacked on the semiconductor chip packages 200A and 200B, as described later.

Figure 4:
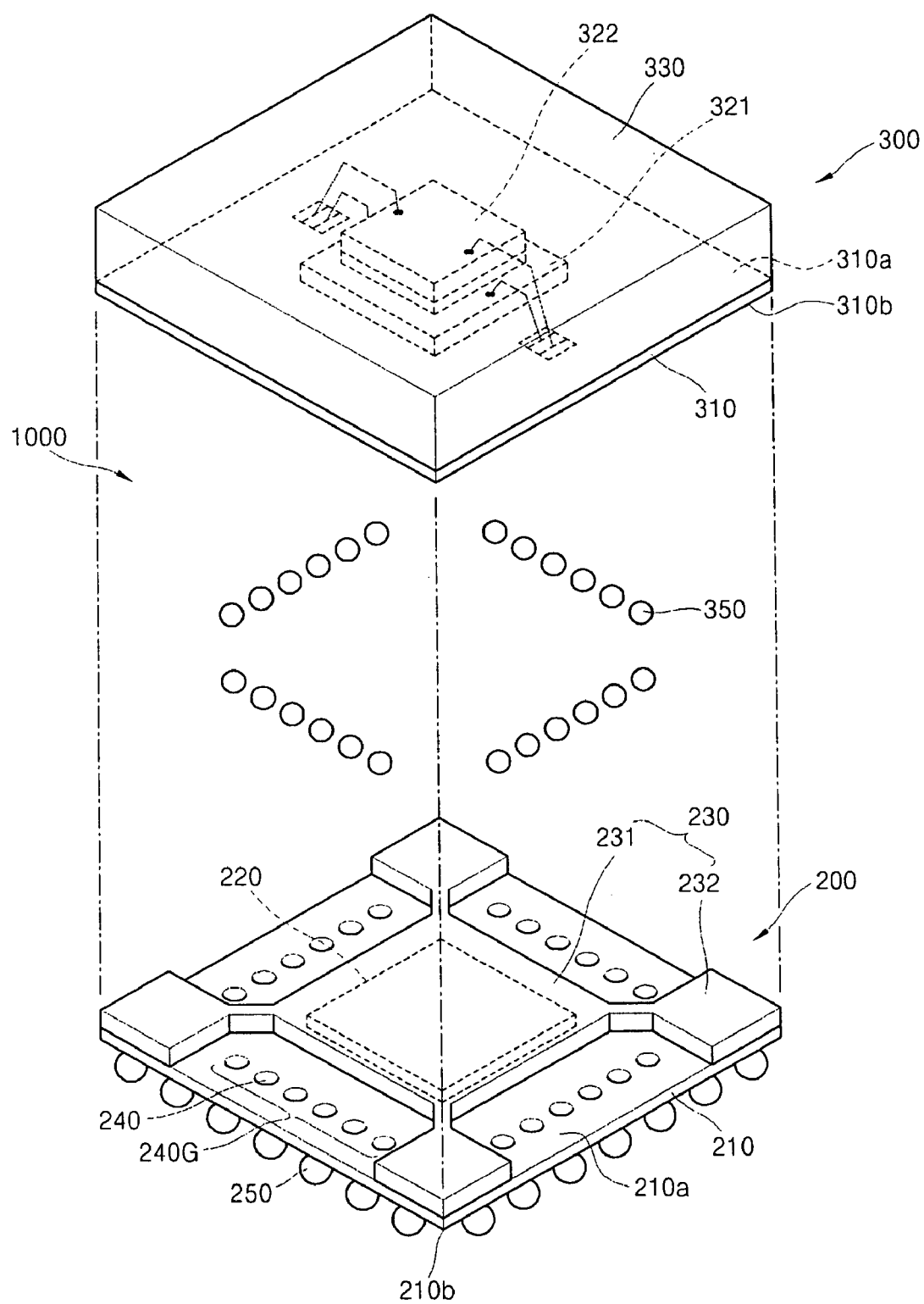
FIG. 4 is an exploded perspective view illustrating an MSP including semiconductor chip packages according to an example embodiment.

FIG. 4 is an exploded perspective view illustrating an MSP 1000 including semiconductor chip packages 200 and 300 according to an example embodiment. In FIG. 4, a first semiconductor chip package 200 may be similar to the semiconductor chip package 200A of FIG. 2. However, the first semiconductor chip package 200 may also be similar to the semiconductor chip package 200B of FIG. 3.

Referring to FIG. 4, as described above with reference to FIGS. 2 and 3, a second semiconductor chip package 300 may be stacked on the first semiconductor chip package 200, on which a molding member 230 including a body 231 and an extension 232 is formed with regard to a first semiconductor chip 220 mounted on a first surface 210a of a first substrate 210.

A second surface 210b, opposite to the first surface 210a of the first substrate 210, may include a plurality of conductors 250 for mounting to be electrically connected to an external circuit, for example, a mother substrate on which the MSP 1000 may be installed. The conductors 250 for mounting may be leads or conductive bumps, which are well known in the related art, used to penetration-mount or surface-mount the MSP 1000 on the mother board. Examples of the conductive bumps may include at least one of deposited metal bumps, solder balls and stud bumps, but are not limited thereto.

In the second semiconductor chip package 300, semiconductor chips 321 and 322 may be mounted on a first surface 310a of a second substrate 310. Although two semiconductor chips 321 and 322 are shown in FIG. 4, example embodiments may include a single semiconductor chip or a plurality of semiconductor chips. The type of the second semiconductor chips 321 and 322 may be the same or different from the type of the first semiconductor chip 220. The first and second semiconductor chips 220, and 321 and 322 may be any combination of a logic chip, a memory chip, an RF communication chip, for example.

In the second semiconductor chip package 300, the entire second substrate 310 may be encapsulated by the molding member 330, unlike the first semiconductor chip package 200. Conductors 350, which are electrically connectable to conductive connection pads 240 disposed on the first substrate 210 of the first semiconductor chip package 200, may be disposed on the second surface 310b of the second substrate 310 for stacking purposes.

As is well known in the related art, the conductors 350 for stacking may be a solder ball, a gold bump, stud bump, or the like, which are formed by various technologies, such as a deposition method or a plating method. According to an example embodiment, the conductors 350 may be formed first on conductive connection pads (not shown) on the second surface 310b of the second substrate 310 of the second semiconductor chip package 300. According to an example embodiment, the conductors 350 may also be formed first on the conductive connection pads 240 of the first semiconductor chip package 200.

After accurately aligning the conductors 350 interposed between the first and second semiconductor chip packages 200 and 300 with the corresponding conductive connection pads, a bonding process, such as a thermo-compression bonding method or a reflow method, may be performed on the conductors 350 to electrically and mechanically combine the first and second semiconductor chip packages 200 and 300.

According to an example embodiment, even if thermo and/or mechanical stress is applied to the boundary portion including the corner portions of the first substrate 210 during bonding, such as by the thermo-compression bonding method or the reflow method, the boundary portions of the first substrate 210 may be strengthened by the extension 232 of the molding member 230. Thus, cracking and/or warpage phenomena of the first substrate 210 may be suppressed or decreased. Specifically, even if the thickness of the first substrate 210 is reduced according to the trend of miniaturization in electronic products, uneven distribution in space between the first and second substrates 210 and 310 is not generated. Accordingly, the first and second substrates 210 and 310 may be accurately aligned, and the MSP 1000 may be mechanically stronger than previously known MSPs.

Figure 5:
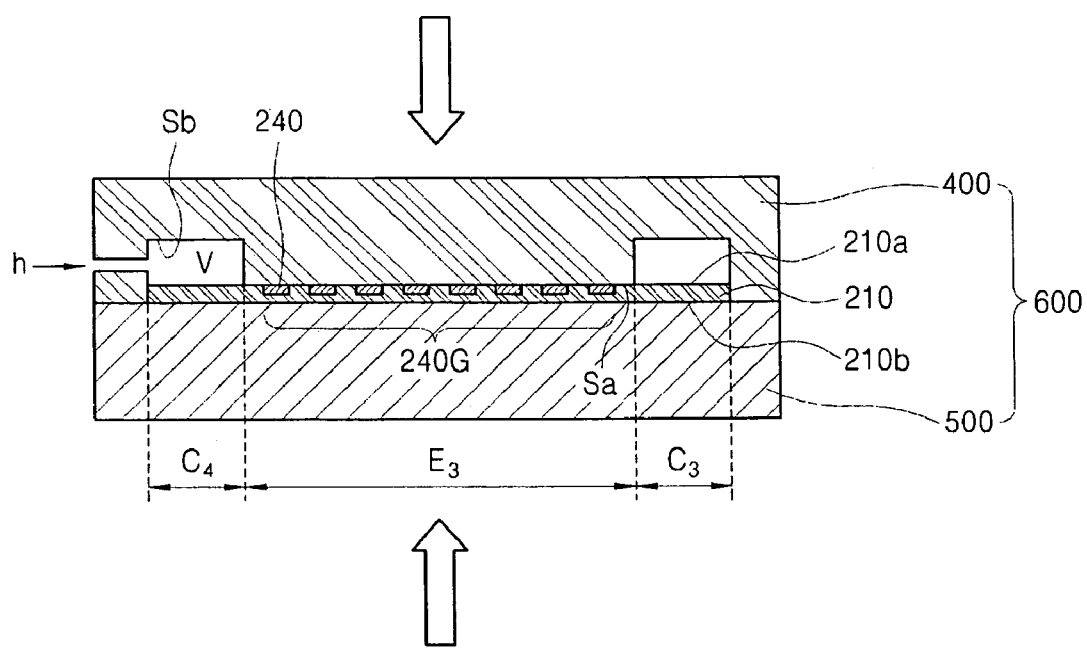
FIG. 5 is a cross-sectional view illustrating a semiconductor package mold for performing partial molding according to an example embodiment.

FIG. 5 is a cross-sectional view illustrating a semiconductor package mold 600 for performing partial molding according to an example embodiment. The cross-sectional view of the substrate 210 of FIG. 5 is a partial cross-sectional view of the substrate 210 taken along a line V-V of FIG. 2.

Referring to FIG. 5, the semiconductor package mold 600 may include a first mold 400 which provides a cavity V for performing a partial molding process according to a transfer molding process, and a second mold 500 which supports the first mold 400 and the substrate 210. The substrate 210, on which the semiconductor chip 220 of FIG. 2 may be mounted, is interposed between the first and second molds 400 and 500. The second mold 500 supports the substrate 210 by contacting a second surface 210b of the substrate 210. The first and second molds 400 and 500 may be compressed to the surfaces of the substrate 210 by the force towards the direction denoted in arrows.

According to an example embodiment, the cavity V of the first mold 400 is defined by an internal surface Sa which contacts a boundary portion $E_3$ (refer to the boundary $E_3$ of FIG. 2) of the first surface 210a of the substrate 210, on which a conductive connection pad group 240G (refer to the conductive connection pad groups 240Ga of FIG. 2) may be formed, and an internal surface Sb which surrounds the upper parts of both corner portions $C_3$ and $C_4$ adjacent to the boundary $E_3$. Accordingly, the remaining space excluding the area that is contacted by the internal surface Sa, that is, the cavity V surrounding the center C on which the semiconductor chip 220 (refer to FIG. 2) of the substrate 210 is disposed and the upper parts of the corners $C_3$ and $C_4$ is formed. FIG. 5 illustrates the molding member 230a on the substrate 210 along the line V-V of FIG. 2, but the first mold 400 described above may also provide a cavity V that surrounds the upper parts of the corner portion $C_1$ and $C_2$.

According to an example embodiment, when there are the boundary portions $E_1$ and $E_3$ on which the conductive connection pad groups 240Gb are not formed, as illustrated in FIG. 3, the first mold 400 may include an internal surface that surrounds the upper parts of the boundary portions $E_1$ and $E_3$ to provide a cavity V that surrounds the center C on which the semiconductor chip 220 is disposed, the corner portions $C_1$, $C_2$, $C_3$, and $C_4$, and the boundary portions $E_1$ and $E_3$ on which the conductive connection pad groups 240Gb are not formed.

A heat curable resin, such as epoxy molding compound for example, may be injected through an injection hole h of the first mold 400 having the cavity V, and then the molding member 230a or 230b including the extension 232a or 232b may be manufactured via a suitable curing process.

According to an example embodiment, cracking and/or warpage of a substrate that may occur while stacking a plurality of semiconductor chip packages may be reduced or minimized by a molding member that covers corners of the substrate with a semiconductor chip mounted on the substrate. As a result, the performance and the durability of the MSP may be improved.

According to an example embodiment, the mechanical strength of boundary portions of a substrate on which a semiconductor chip is mounted may be increased by performing a partial molding process that covers corner portions of the substrate. Accordingly, a plurality of semiconductor chip packages may be more easily stacked, and thus a yield may be improved.

In addition, an example embodiment of a semiconductor package mold for fabricating an MSP may include a cavity that is defined by an internal surface contacting boundary portions of a substrate on which conductive connection pad groups are formed, and thus a partial molding process that covers a semiconductor chip and corner portions of the substrate may be performed.

While example embodiments have been particularly shown and described with reference to the drawings, it will be understood by those of ordinary skill in the art that various changes in form and details may be made therein without departing from the spirit and scope of example embodiments as defined by the following claims.

What is claimed is:

1. A package, comprising:
  a first semiconductor chip package including,
    a first substrate having a first surface and at least one first boundary portion,
    a first semiconductor chip on the first surface inside of the at least one first boundary portion,
    a plurality of conductive connection pads on the at least one first boundary portion, and
    a molding member having a body and at least one extension, the body sandwiching the first semiconductor chip between the first substrate and the body, and the at least one extension extending from the body and over the at least one first boundary portion, the extension not extending over at least one of the conductive connection pads.

2. The package of claim 1, wherein the at least one extension extends toward a corner of the first surface.

3. The package of claim 1, wherein the first semiconductor chip package further includes,
  a plurality of conductive connection pad groups arranged on the at least one first boundary portion.

4. The package of claim 3, wherein the at least one extension avoids the plurality of conductive connection pad groups.

5. The package of claim 1, wherein the at least one extension of the molding member covers at least one corner portion of the first surface of the first substrate.

6. The package of claim 1, wherein the first surface of the first substrate includes,
  at least one second boundary portion on which a conductive connection pad group is not formed, and wherein
  the at least one extension of the molding member covers each corner portion adjacent to the at least one secondary boundary portion and at least a part of the secondary boundary portion.

7. The package of claim 1, wherein the first semiconductor chip is electrically connected to the first surface of the first substrate.

8. The package of claim 1, wherein the first substrate further includes,
  a second surface opposite to the first surface, the second surface having a plurality of conductors.

9. The package of claim 8, wherein the plurality of conductors are at least one of leads and conductive bumps.

10. The package of claim 9, wherein, if the plurality of conductors include conductive bumps, the conductive bumps are at least one of deposited metal bumps, solder balls, and stud bumps.

11. The package of claim 1, further comprising:
  a second semiconductor chip package stacked on the first semiconductor chip package, the second semiconductor chip package including,
    a second substrate on which at least one second semiconductor chip is electrically connected to the first semiconductor chip package.

12. The package of claim 11, wherein at least one of the first and second substrates include a printed circuit substrate formed of one of a ceramic or a flexible resin.

13. The package of claim 11, wherein the first and second semiconductor chips are different types.

14. The package of claim 11, wherein at least one of the first and second semiconductor chips includes one or more of a logic chip, a memory chip, and an RF communication chip.

15. The package of claim 11, wherein the second substrate includes,
  a third surface on which the second semiconductor chip is mounted, and a fourth surface opposite to the third surface, and wherein
  the fourth surface includes a plurality of conductors for connecting to a conductive connection pad group arranged on the first substrate.

16. The package of claim 15, wherein the plurality of conductors are conductive bumps.

17. The package of claim 16, wherein the conductive bumps are at least one of solder balls, gold bumps, and stud bumps.

18. The package of claim 16, wherein the first semiconductor chip is mounted on a center portion of the first substrate.

19. The package of claim 1, further comprising:
  a plurality of conductors formed on the conductive connection pads, the molding member not being in contact with the conductors.

20. A method of fabricating a package, the method comprising:
  mounting a first semiconductor chip on a first surface of a first substrate, the first substrate including a portion on which the first semiconductor chip is mounted and at least one first boundary portion on which a plurality of conductive connection pads are formed, and a second surface which includes a plurality of conductors for mounting; and
  forming a molding member including a body and at least one extension, the body sandwiching the first semiconductor chip between the first substrate and the body, and the at least one extension extending from the body and over the at least one first boundary portion, the extension not extending over at least one of the conductive connection pads.

21. The method of claim 20, wherein the forming of the molding member is performed using a transfer molding method.

22. The method of claim 20, further including,
  stacking a second semiconductor chip package on the first substrate, the semiconductor chip package including,
    a second substrate that includes a third surface on which at least one second semiconductor chip is mounted, and a fourth surface including a plurality of conductors for connecting to the conductive connection pads of the first substrate.

23. The method of claim 22, wherein the stacking the second semiconductor chip package includes,
  aligning the conductors for stacking with the conductive connection pads of the first substrate, and coupling the conductors for stacking and the conductive connection pads of the first substrate.

24. The method of claim 23, wherein the coupling of the conductors for stacking and the conductive connection pads of the first substrate is performed using one of a thermocompression bonding method or a reflow method on the conductive connection pads.

25. The method of claim 20, wherein the forming the molding member includes, forming the at least one extension toward a corner of the first surface of the first substrate while avoiding the conductive connection pads of the first substrate.

* * * * *